(12) United States Patent
Chang

(10) Patent No.: US 7,492,037 B2
(45) Date of Patent: Feb. 17, 2009

(54) PACKAGE STRUCTURE AND LEAD FRAME USING THE SAME

(75) Inventor: Pen-Chieh Chang, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 7 days.

(21) Appl. No.: 11/594,067

(22) Filed: Nov. 8, 2006

(65) Prior Publication Data
US 2007/0284705 A1    Dec. 13, 2007

(30) Foreign Application Priority Data
May 22, 2006   (TW) ............................. 95118170 A

(51) Int. Cl.
*H01L 23/48* (2006.01)
(52) U.S. Cl. ................ 257/666; 257/676; 438/123
(58) Field of Classification Search ................ 257/666, 257/676; 438/123
See application file for complete search history.

(56) References Cited

U.S. PATENT DOCUMENTS

| | | | | |
|---|---|---|---|---|
| 5,397,915 A | * | 3/1995 | Nose | ........................... 257/676 |
| 6,197,615 B1 | * | 3/2001 | Song et al. | ................... 438/111 |
| 6,303,985 B1 | * | 10/2001 | Larson et al. | ................ 257/676 |

\* cited by examiner

*Primary Examiner*—Roy K Potter
(74) *Attorney, Agent, or Firm*—Rabin & Berdo, P.C.

(57) ABSTRACT

A package structure and a lead frame using the same are provided. The package structure includes a lead frame, a chip and an adhesive. The lead frame has a first surface and a second surface opposite to the first surface. The first surface has a chip adherent area. The lead frame includes a plurality of through holes and grooves. The through holes penetrate through the first surface and the second surface to be disposed around the chip adherent area. The grooves are disposed on the first surface. The grooves connect the neighboring through holes to form an annular trace disposed around the chip adherent area. The chip is disposed on the chip adherent area. The adhesive is disposed between the chip and the lead frame, and is diffused in the annular trace.

15 Claims, 4 Drawing Sheets

US 7,492,037 B2

PACKAGE STRUCTURE AND LEAD FRAME USING THE SAME

This application claims the benefit of Taiwan application Serial No. 095118170, filed May 22, 2006, the subject matter of which is incorporated herein by reference.

BACKGROUND OF THE INVENTION

1. Field of the Invention

The invention relates in general to a package structure and a lead frame using the same, and more particularly to a package structure preventing the diffusion of adhesive via using the through holes and the grooves to form a rectangular shaped trace and a lead frame using the same.

2. Description of the Related Art

Semiconductor package technology covers a semiconductor chip by a molding compound to prevent the chip from getting moistured or collided. The microelectronic elements and circuits inside the chip are electrically connected to the external via a bump, a lead frame or a bonding wire. As various electronic products are provided and the demand for chips is increasing dramatically, the semiconductor package technology plays a crucial role in the development of today's industrial technology.

Referring to FIG. 1, a side view of a conventional package structure is shown. The conventional package structure 100 includes a lead frame 110, a chip 120, an epoxy 130 and a molding compound 140. The lead frame 110 has a first surface 110a and a second surface 110b opposite to the first surface 110a. The first surface 110a of the lead frame 110 has a chip adherent area 110c. The chip 120 is disposed on the chip adherent area 110c. The epoxy 130 is disposed between the chip 120 and the lead frame 110. The molding compound 140 covers the chip 120 to prevent the chip 120 from getting moistured or collided.

Referring to FIG. 2, a top view of a lead frame, a chip and an epoxy of FIG. 1 is shown. The lead frame 110 includes a plurality of through holes 111. The through holes 111 penetrate through the first surface 110a and the second surface 110b to be disposed around the chip adherent area 110c. The molding compound 140 of FIG. 1 flows from the first surface 110a to the through holes 111 and arrives at the second surface 110b of the lead frame 110, such that the structure of the lead frame 110 is strengthened.

The epoxy 130 is a sticky liquid. During the manufacturing process, the epoxy 130 is easy to be diffused but difficult to be maintained within the chip adherent area 110c. Especially when the chip 120 is disposed on the epoxy 130, the diffusing area of the epoxy 130 is even hard to control as shown in FIG. 1 and FIG. 2.

To enhance the structural strength of the package structure 100 has always been an aim to be achieved. The through holes 111 disclosed above are a design for enhancing the structure. However, the epoxy 130 is diffused on the lead frame 110 and severely affects the structural strength of the package structure 100. As shown in FIG. 1, in the diffusing area of the epoxy 130, the molding compound 140 fails to cover the lead frame 110 well. When the molding compound 140 is solidified, aperture and cleft are formed inside the package structure 100, severely deteriorating the structural strength of the package structure 100. Therefore, how to overcome the above problem has become an imminent issue to be resolved.

SUMMARY OF THE INVENTION

It is therefore an object of the invention to provide a package structure and a lead frame using the same. The design of connecting the neighboring through holes by the grooves enables the package structure to effectively control the diffusion of the adhesive, largely reduce manufacturing cost and enhance the structural strength of the package structure.

The invention achieves the above-identified object by providing a package structure. The package structure includes a lead frame, a chip and an adhesive. The lead frame has a first surface and a second surface opposite to the first surface. The first surface has a chip adherent area. The lead frame includes a plurality of through holes and grooves. The through holes penetrate through the first surface and the second surface to be disposed around the chip adherent area. The grooves are disposed on the first surface. The grooves connect the neighboring through holes to form a rectangular shaped trace disposed around the chip adherent area. The chip is disposed on the chip adherent area. The adhesive is disposed between the chip and the lead frame, and is diffused in the rectangular shaped trace.

The invention further achieves the above-identified object by providing a lead frame. The lead frame has a first surface and a second surface opposite to the first surface. The first surface has a chip adherent area. The lead frame is used for carrying a chip. The chip is bonded onto the chip adherent area by an adhesive. The lead frame includes a plurality of through holes and grooves. The through holes penetrate through the first surface and the second surface to be disposed around the chip adherent area. The grooves are disposed on the first surface. The grooves connect the neighboring through holes to form a rectangular shaped trace disposed around the chip adherent area. The adhesive is diffused in the rectangular shaped trace.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
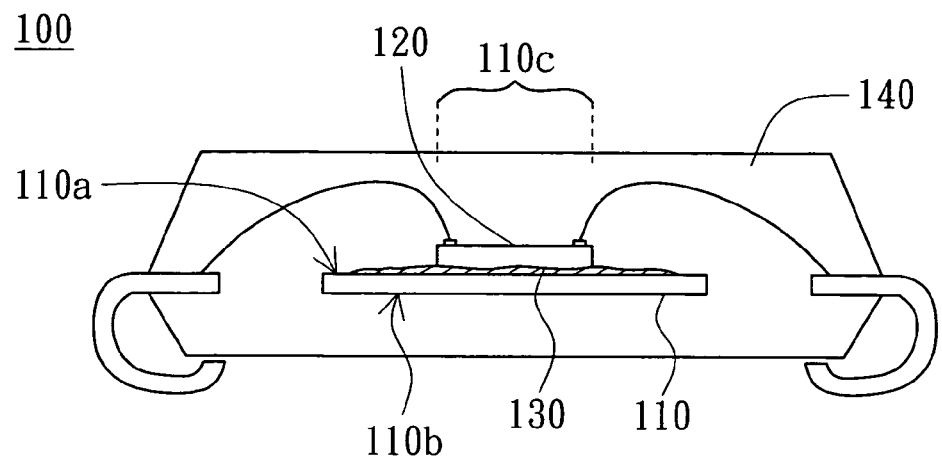
FIG. 1 is a side view of a conventional package structure.
Figure 2:
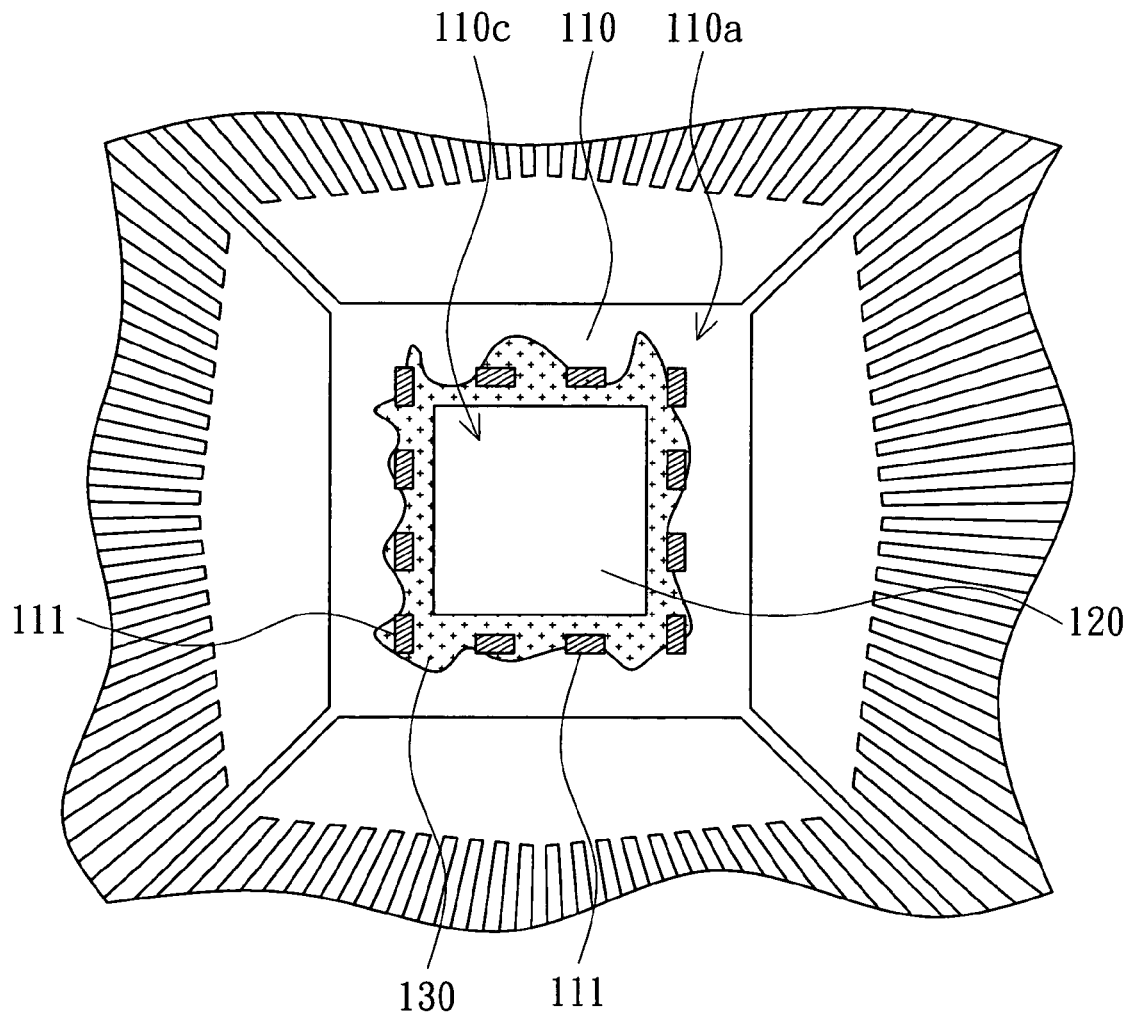
FIG. 2 is a top view of a lead frame, a chip and an epoxy of FIG. 1.
Figure 3:
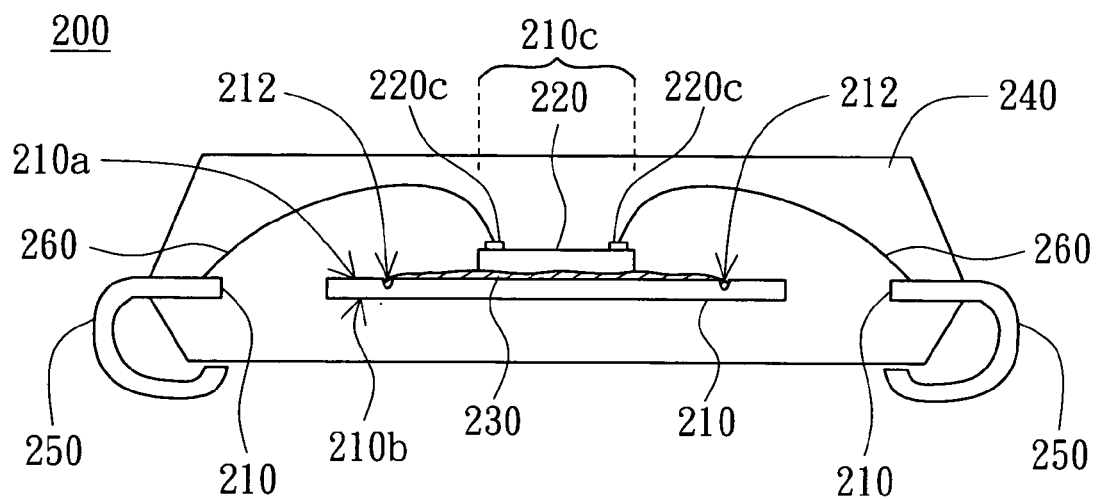
FIG. 3 is a diagram of a package structure according to a preferred embodiment of the invention.
Figure 4:
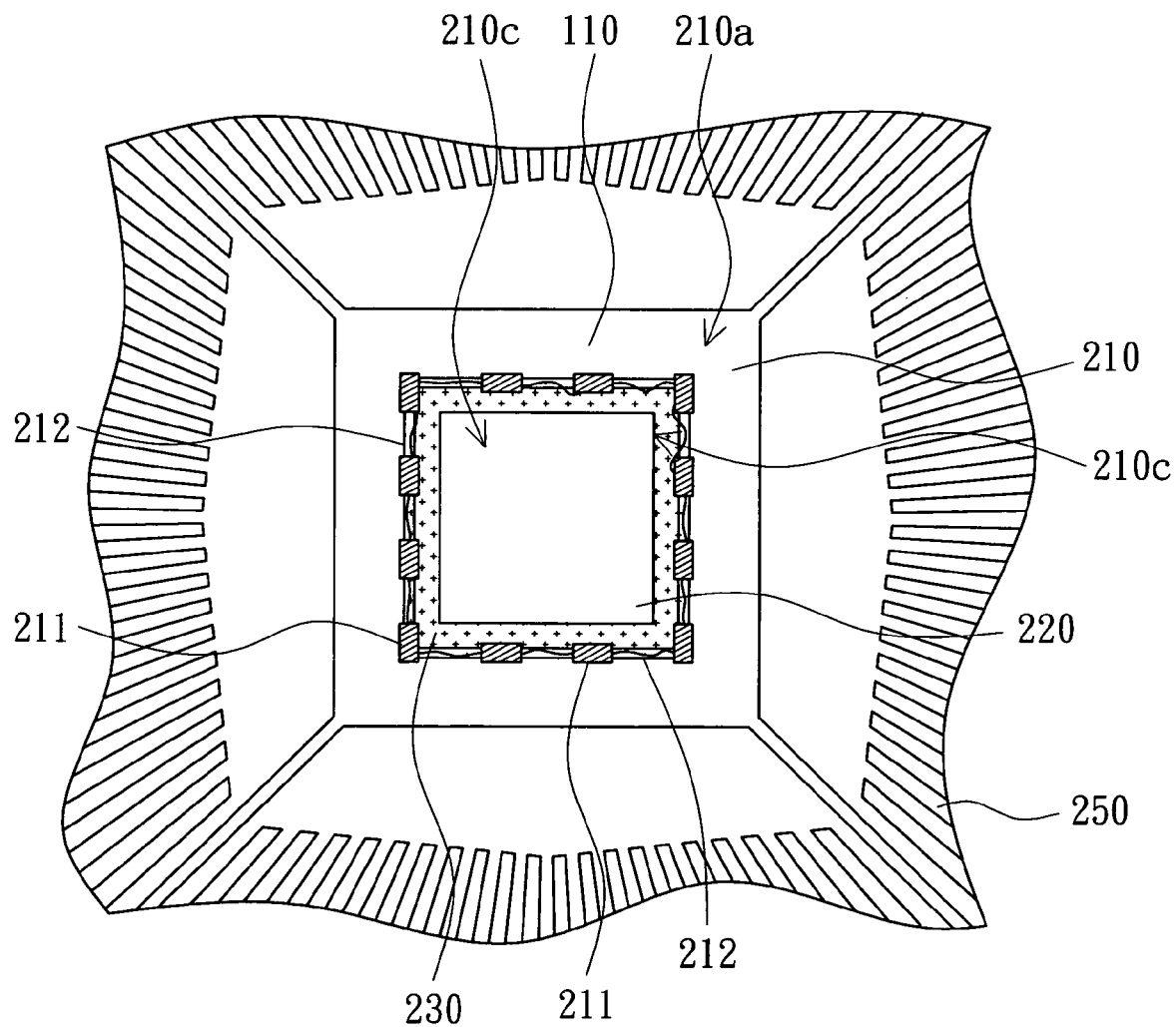
FIG. 4 is a top view of a lead frame, a chip and an adhesive of FIG. 3.

Referring to both FIG. 3 and FIG. 4. FIG. 3 is a diagram of a package structure according to a preferred embodiment of the invention. FIG. 4 is a top view of a lead frame, a chip and an adhesive of FIG. 3. As shown in FIG. 3, the package structure 200 at least includes a lead frame 210, a chip 220 and an adhesive 230. The lead frame 210 has a first surface 210a and a second surface 210b opposite to the first surface. The first surface 210a of the lead frame 210 has a chip adherent area 210c. The chip 220 is disposed on the chip adherent area 210c. The adhesive 230 is disposed between the chip 220 and the lead frame 210.

As shown in FIG. 4, the lead frame 210 includes a plurality of through holes 211 and grooves 212. The through holes 211 penetrate through the first surface 210a and the second surface 201b to be disposed around the chip adherent area 210c. The grooves 212 are disposed on the first surface 210a. The grooves 212 connect the neighboring through holes 211 to form a rectangular shaped trace disposed around the chip adherent area 210c. The adhesive 230 is diffused in the rectangular shaped trace.

To better understand the manufacturing process of the package structure 200 and the diffusing process of the adhesive 230, the manufacturing process of the package structure 200 of the present embodiment of the invention is elaborated below by accompanied drawings.

Referring to FIG. 5A~5E, a manufacturing process of a package structure of the present embodiment of the invention is shown. Firstly, proceed to FIG. 5A, a lead frame 210 is provided. The lead frame 210 includes a plurality of grooves 212. The grooves 212 may be formed by etching process or laser process. However, the formation method of the grooves 212 does not restrict the scope of technology of the invention. The lead frame 210 further includes a plurality of leads 250. The leads 250 radiatively arranged on the peripheral of the chip adherent area 210c as shown in FIG. 4.

Figure 5A:
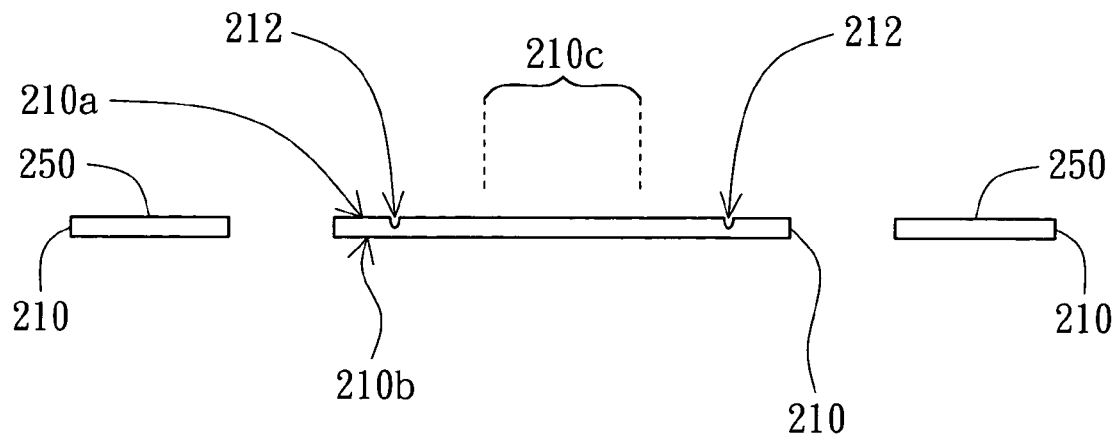
FIGS. 5A~5E illustrate a manufacturing process of a package structure of the present embodiment of the invention.
Figure 5B:
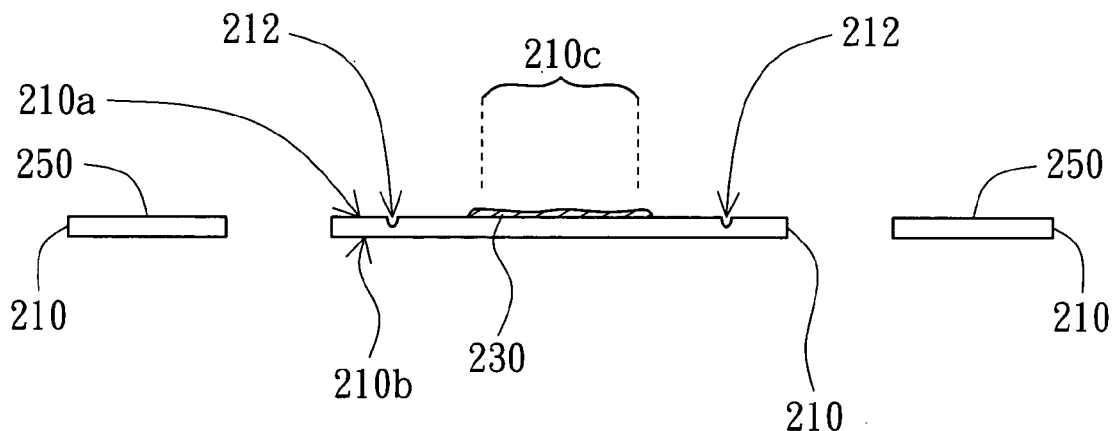

Next, proceed to FIG. 5B, an adhesive 230 is pasted on the area within the chip adherent area 210c. In the present embodiment of the invention, the adhesive 230 is an epoxy.

Figure 5C:
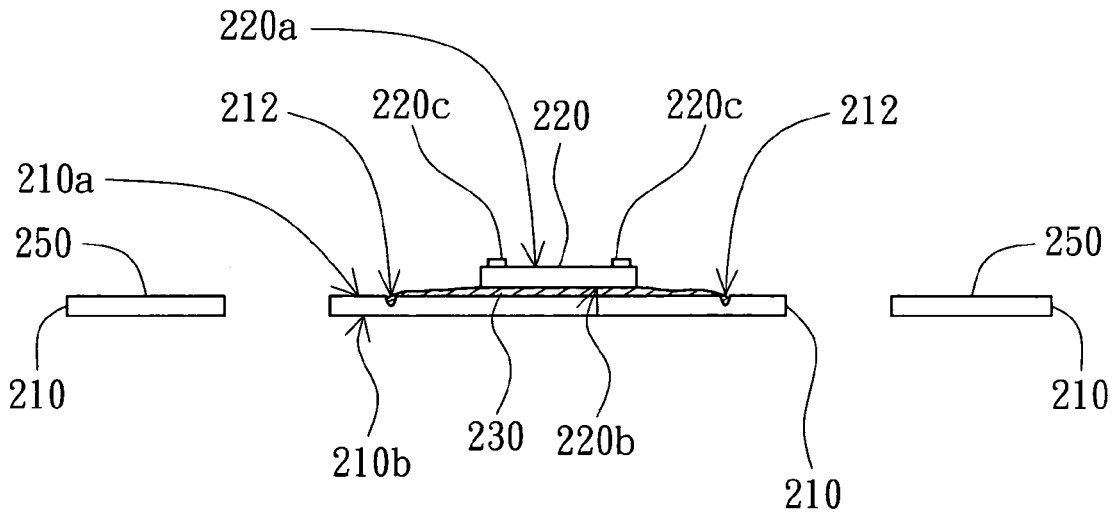

Then, proceed to FIG. 5C, a chip 220 is disposed within the chip adherent area 210c. The chip 220 has an active surface 220a and a passive surface 220b. The active surface 220a has a plurality of connecting pads 220c. The adhesive 230 is disposed between the passive surface 220b of the chip 220 and the lead frame 210 for bonding the chip 220 onto the area within the chip adherent area 210c.

Referring to FIG. 4 and FIG. 5C. The grooves 212 and the through holes 211 are disposed around the chip adherent area 210c to form a rectangular shaped trace, therefore the diffusion of the adhesive 230 is stopped by the rectangular shaped trace when the adhesive 230 is diffused outwardly from the chip adherent area 210c. Thus, the diffusion of the adhesive 230 during the manufacturing process of the package structure 200 is greatly improved.

Preferably, in order to minimize the diffusing area of the adhesive 230 (the area enclosed by the rectangular shaped trace), the shape of the rectangular shaped trace is better similar to the chip adherent area 210c, that is, a quadrilateral, such that the diffusion of the adhesive 230 is best resolved.

Figure 5D:
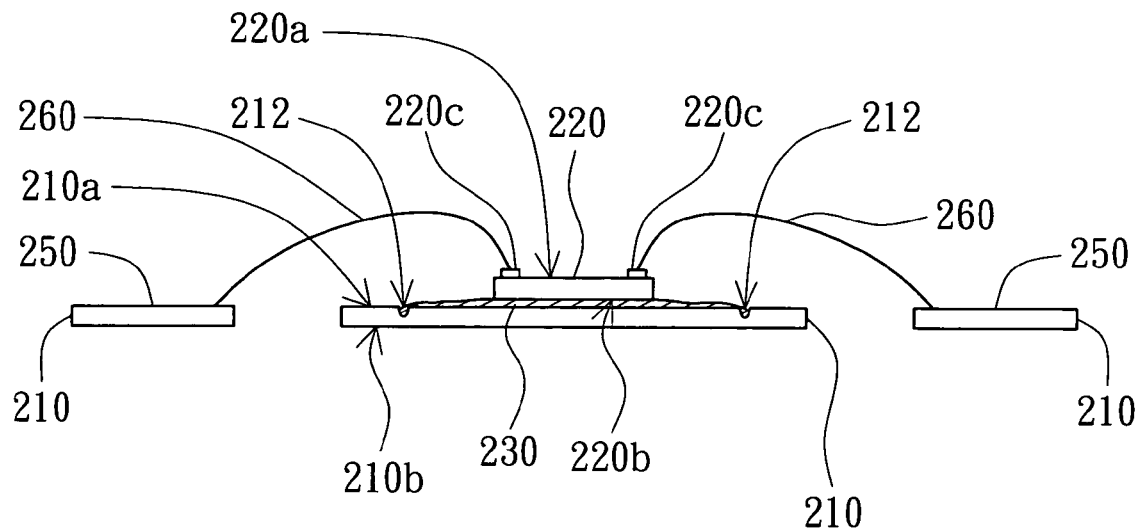

Then, proceed to FIG. 5D, the connecting pad 220c and the lead 250 are wiring bonded by bonding wires 260.

Figure 5E:
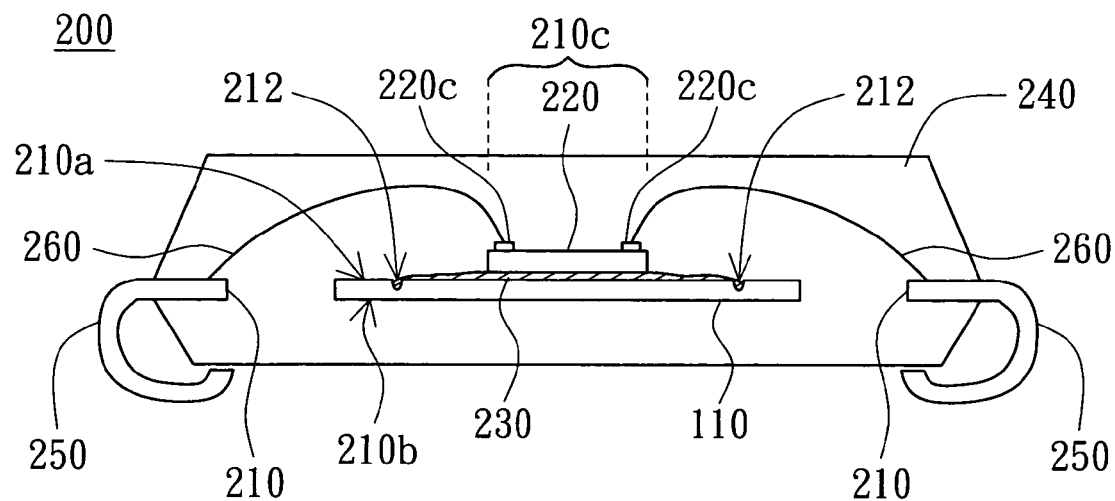

Afterwards, proceed to FIG. 5E, the chip 220 is covered by a package material 240. The package material 240 covers the first surface 210a and the second surface 210b of the lead frame 210, the through holes 211, the grooves 212 and a part of the lead 250. The exposed part of the lead 250 is for electrically connecting with the external. Next, the package material 240 is solidified and the exposed part of the lead 250 is bent into an L shape or J shape. Thus, the package structure 200 is completed.

Despite the adhesive of the invention is exemplified by an epoxy in the above embodiment, however, examples of the adhesive of the invention include various types of liquid adhesive for bonding the chip and the substrate board. Any design preventing the diffusion of the adhesive by using the grooves of the invention to form a rectangular shaped trace is within the scope of technology of the invention.

According to the package structure and the lead frame using the same disclosed in the above embodiment of the invention, the design of connecting the neighboring through holes by the grooves enables the package structure to have the following advantages:

Firstly, the diffusion of the adhesive is effectively controlled. The diffusion of adhesive during the manufacturing process of the package structure has always been a problem to the semiconductor packaging industry. In the package structure of the invention, a rectangular shaped trace is formed by connecting the grooves and the through holes, such that the diffusion of adhesive is enclosed by the ring rectangular shaped trace. Thus, the diffusion of adhesive is electively controlled.

Secondly, the manufacturing cost is largely reduced. Conventional manufacturing process of package structure is incapable of replacing liquid adhesive with solid adhesive, therefore the adhesive will be diffused easily and greatly increase the defect rate of products. A product defected by the diffusion of adhesive can not be re-worked or fixed. Therefore, the package structure using the lead frame of the invention largely reduces not only the defect rate but also the manufacturing cost.

Thirdly, the structural strength of the package structure is greatly enhanced. In the package structure of the invention, the package material covers the lead frame well. No aperture or cleft is formed inside the package structure after the package material is solidified, largely enhancing the structural strength of the package structure.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A package structure, comprising:
    a lead frame having a first surface and a second surface opposite to the first surface, wherein the first surface has a chip adherent area, the lead frame comprises:
    a plurality of through holes for penetrating through the first surface and the second surface to be disposed around the chip adherent area; and
    a plurality of grooves disposed on the first surface for connecting neighboring through holes to form a rectangular shaped trace disposed around the chip adherent area;
    a chip disposed on the chip adherent area; and
    an adhesive disposed between the chip and the lead frame and diffused in the rectangular shaped trace.

2. The package structure according to claim 1, wherein the lead frame further comprises:
    a plurality of conducting wire leads radiatively arranged on the peripheral of the chip adherent area.

3. The package structure according to claim 1, wherein the chip adherent area is a quadrilateral.

4. The package structure according to claim 1, wherein the adhesive is an epoxy.

5. The package structure according to claim 1, the package structure further comprises:
    a package material covering the chip.

6. A lead frame having a first surface and a second surface opposite to the first surface, wherein the first surface has a chip adherent area, the lead frame is used for carrying a chip bonded onto the chip adherent area, the lead frame comprises:
    a plurality of through holes for penetrating through the first surface and the second surface to be disposed around the chip adherent area; and
    a plurality of grooves disposed on the first surface for connecting neighboring through holes to form a ring rectangular shaped trace disposed around the chip adherent area.

7. The lead frame according to claim 6, further comprising:
a plurality of conducting wire leads radiatively arranged on the peripheral of the chip adherent area.

8. The lead frame according to claim 6, wherein the chip adherent area is a quadrilateral.

9. A method for manufacturing a package structure, comprising:
providing a lead frame having a first surface and a second surface opposite to the first surface, wherein the first surface has a chip adherent area, the lead frame comprises a plurality of through holes and a plurality of grooves, the plurality of through holes are for penetrating through the first surface and the second surface to be disposed around the chip adherent area, and the plurality of grooves are disposed on the first surface for connecting neighboring through holes to form a rectangular shaped trace disposed around the chip adherent area;
disposing a chip on the chip adherent area; and
disposing an adhesive between the chip and the lead frame and diffused in the rectangular shaped trace.

10. The method according to claim 9, wherein in the step of providing the lead frame, the plurality of grooves are formed by an etching process.

11. The method according to claim 9, wherein in the step of providing the lead frame, the plurality of grooves are formed by a laser etching process.

12. A package structure, comprising:
a lead frame having a first surface and a second surface opposite to the first surface, wherein the first surface has a chip adherent area, the lead frame comprises:
a plurality of through holes for penetrating through the first surface and the second surface to be disposed around the chip adherent area; and
a plurality of grooves disposed on the first surface for connecting neighboring through holes to form a closed loop enclosing the chip adherent area;
a chip disposed on the chip adherent area; and
an adhesive disposed between the chip and the lead frame and diffused in the closed loop.

13. The package structure according to claim 12, wherein the lead frame further comprises: a plurality of conducting wire leads radiatively arranged on the peripheral of the chip adherent area.

14. The package structure according to claim 12, wherein the adhesive is an epoxy.

15. The package structure according to claim 12, the package structure further comprises:
a package material covering the chip.

* * * * *